(12) United States Patent
Anderson et al.

(10) Patent No.: US 8,557,647 B2
(45) Date of Patent: Oct. 15, 2013

(54) METHOD FOR FABRICATING FIELD EFFECT TRANSISTOR DEVICES WITH HIGH-ASPECT RATIO MASK

(75) Inventors: Brent A. Anderson, Jericho, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/229,154

(22) Filed: Sep. 9, 2011

(65) Prior Publication Data

US 2013/0065370 A1    Mar. 14, 2013

(51) Int. Cl.
H01L 21/335 (2006.01)
H01L 21/8232 (2006.01)
H01L 21/336 (2006.01)
H01L 21/8234 (2006.01)
H01L 21/00 (2006.01)

(52) U.S. Cl.
USPC .................... 438/197; 438/142; 257/E21.002

(58) Field of Classification Search
USPC ................................................ 438/142–308
See application file for complete search history.

(56) References Cited

U.S. PATENT DOCUMENTS

| | | | |
|---|---|---|---|
| 4,810,601 A | 3/1989 | Allen et al. | |
| 5,429,956 A * | 7/1995 | Shell et al. | 438/291 |
| 5,656,523 A | 8/1997 | Wilhoit | |
| 5,960,315 A | 9/1999 | Gambino et al. | |
| 6,008,096 A * | 12/1999 | Gardner et al. | 438/300 |
| 6,060,345 A * | 5/2000 | Hause et al. | 438/199 |
| 6,248,629 B1 | 6/2001 | Liu et al. | |
| 6,274,479 B1 | 8/2001 | Srinivasan | |
| 6,285,061 B1 * | 9/2001 | Shell et al. | 257/344 |
| 6,316,169 B1 * | 11/2001 | Vahedi et al. | 430/329 |
| 6,380,030 B1 * | 4/2002 | Chen et al. | 438/257 |
| 6,440,789 B1 | 8/2002 | Hamilton et al. | |
| 6,531,266 B1 | 3/2003 | Chang et al. | |
| 6,995,437 B1 | 2/2006 | Kinoshita et al. | |
| 7,052,965 B2 | 5/2006 | Park et al. | |
| 7,670,905 B2 * | 3/2010 | Kiehlbauch | 438/257 |
| 7,749,874 B2 * | 7/2010 | Drowley et al. | 438/514 |
| 8,329,527 B2 * | 12/2012 | Ghozeil et al. | 438/197 |
| 8,361,564 B2 * | 1/2013 | Romano et al. | 427/526 |
| 2003/0042558 A1 * | 3/2003 | Noguchi et al. | 257/406 |
| 2004/0157398 A1 * | 8/2004 | Keum | 438/305 |
| 2005/0133828 A1 * | 6/2005 | Hsiao et al. | 257/244 |
| 2007/0029608 A1 * | 2/2007 | Huang | 257/327 |
| 2007/0161173 A1 * | 7/2007 | Kerr et al. | 438/197 |
| 2008/0124830 A1 * | 5/2008 | Lee | 438/59 |
| 2009/0001446 A1 * | 1/2009 | Kim | 257/316 |
| 2009/0087990 A1 * | 4/2009 | Yatsuda et al. | 438/694 |
| 2010/0065531 A1 * | 3/2010 | Kiehlbauch et al. | 216/41 |
| 2010/0330808 A1 * | 12/2010 | Richter et al. | 438/691 |
| 2011/0027950 A1 * | 2/2011 | Jones et al. | 438/155 |
| 2011/0159648 A1 * | 6/2011 | Ghozeil et al. | 438/197 |

* cited by examiner

Primary Examiner — Seahvosh Nikmanesh
Assistant Examiner — Evren Seven
(74) Attorney, Agent, or Firm — Cantor Colburn LLP; Richard Kotulak

(57) ABSTRACT

A method for forming feature on a substrate includes forming at least one layer of a feature material on a substrate, patterning a photolithographic resist material on the at least one layer of the feature material, removing portions of the feature material to define a feature, depositing a masking material layer over the resist material and exposed regions of the substrate, modifying a portion of the substrate, and removing the masking material layer and the resist material.

16 Claims, 15 Drawing Sheets

METHOD FOR FABRICATING FIELD EFFECT TRANSISTOR DEVICES WITH HIGH-ASPECT RATIO MASK

BACKGROUND

The present invention relates to field effect transistor devices, and more specifically, to methods for fabricating field effect transistor devices.

Field effect transistor devices often include a gate stack disposed on a silicon substrate. Source and drain regions may be formed adjacent to the gate stack using ion implantation methods. High energy ion implantation methods are useful for implanting ions deeply in the source and drain regions, however high energy implantation methods may undesirably damage existing structures that have been formed on the substrate.

BRIEF SUMMARY

According to one embodiment of the present invention, a method for forming feature on a substrate includes forming at least one layer of a feature material on a substrate, patterning a photolithographic resist material on the at least one layer of the feature material, removing portions of the feature material to define a feature, depositing a masking material layer over the resist material and exposed regions of the substrate, modifying a portion of the substrate, and removing the masking material layer and the resist material.

According to another embodiment of the present invention, a method for forming a field effect transistor device includes forming layers of gate stack materials on a substrate, patterning a photolithographic resist material on the layers of gate stack materials, removing portions of the gate stack materials to define a gate stack, depositing a masking material layer over the resist material and exposed regions of the substrate, removing portions of the masking material layer to define a spacer, and implanting ions in the substrate.

According to yet another embodiment of the present invention, a method for forming a field effect transistor device includes forming layers of gate stack materials on a substrate and over a source and drain extension portion disposed on the substrate, patterning a photolithographic resist material on the layers of gate stack materials, removing portions of the gate stack materials to define a gate stack, depositing a masking material layer over the resist material and exposed regions of the substrate and the source and drain extension portion, removing portions of the masking material layer to define a spacer, and implanting ions in the source and drain extension region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-5 illustrate a side cut-away view of an exemplary method for fabricating a field effect transistor (FET) device, in which:

FIG. 2 illustrates the resultant structure following the removal of portions of the gate material layer and the capping layer;

FIG. 3 illustrates the deposition of a masking layer;

FIG. 5 illustrates the resultant structure following the removal of the masking layer and the resist material.

FIGS. 6-9 illustrate an alternate exemplary method for forming a FET device, in which:

FIG. 7 illustrates the resultant structure following the removal of portions of the masking layer;

FIG. 8 illustrates the implantation of ions;

FIG. 9 illustrates the resultant structure following the removal of the spacers and the resist material;

FIGS. 10-14 illustrate a side cut-away view of an alternate exemplary method for forming a multi-gate field effect transistor device, in which:

FIG. 10 illustrates a portion of a multi-gate field effect transistor device;

FIG. 11 illustrates the deposition of a masking layer;

FIG. 12 illustrates the resultant structure following the removal of portions of the masking layer;

FIG. 13 illustrates the implantation of ions; and

FIG. 14 illustrates the resultant structure following the removal of the spacers.

DETAILED DESCRIPTION

Field effect transistor devices (FETs) include source and drain regions that may be formed by ion implantation methods following the formation of a gate stack on a substrate. High energy ion implantation methods increase the penetration of ions in features that are exposed to the ions. In this regard, a protective masking layer is applied over regions of the device such as the gate stack and proximal substrate to prevent ion implantation in undesirable regions. Forming a photoresist masking layer over a gate stack following the formation of the gate stack is problematic since precisely aligning a photoresist mask over the gate stack may be difficult. Thus, a method for self aligning a masking layer to protect a gate stack and portions of the source and drain regions during ion implantation is desired.

Figure 1:
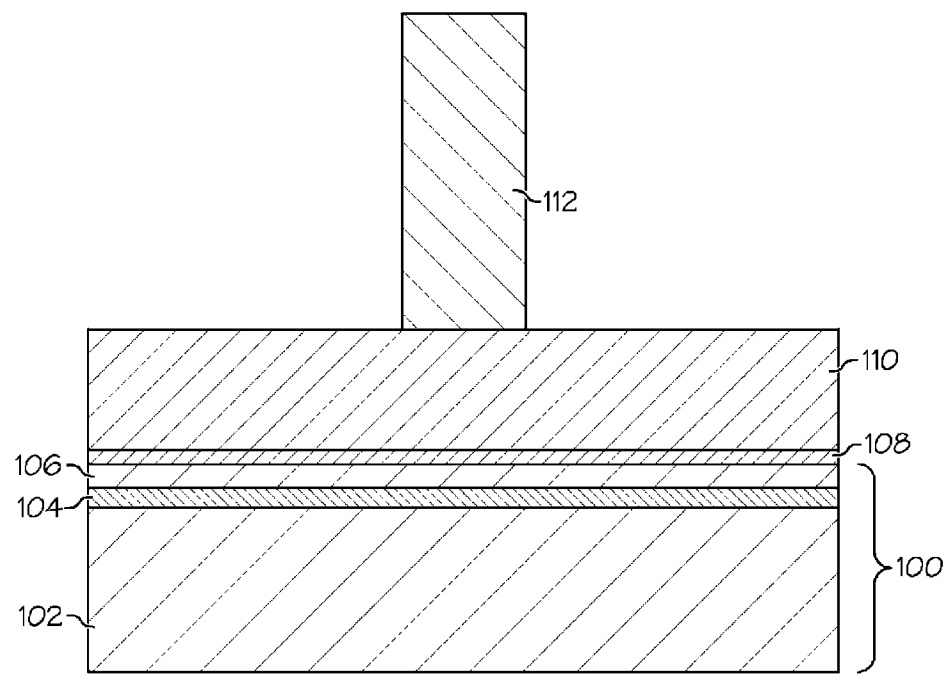

FIGS. 1-4B illustrate a side cut-away view of an exemplary method for fabricating a field effect transistor (FET) device. Referring to FIG. 1, a substrate 100 includes a first silicon layer 102, a dielectric layer 104 disposed on the first silicon layer 102, and a second silicon layer 106 disposed on the dielectric layer 104. The substrate 100 of the illustrated embodiment is merely an example, any other type of substrate arrangement may be used in alternative embodiments. A gate material layer 108 is formed on the second silicon layer 106, and a capping layer 110 is formed on the gate material layer 108. The gate material layer 108 may include, for example, a gate oxide material (e.g., $SIO_2$) or another dielectric material. The capping layer 110 in the illustrated embodiment includes a polysilicon material. In alternate embodiments, any combination of gate material layers and capping layers may be formed to fabricate any type of gate (e.g., a metal oxide FET, or carbon based FET). A photolithographic resist material 112 is patterned on the capping layer 110.

Figure 2:
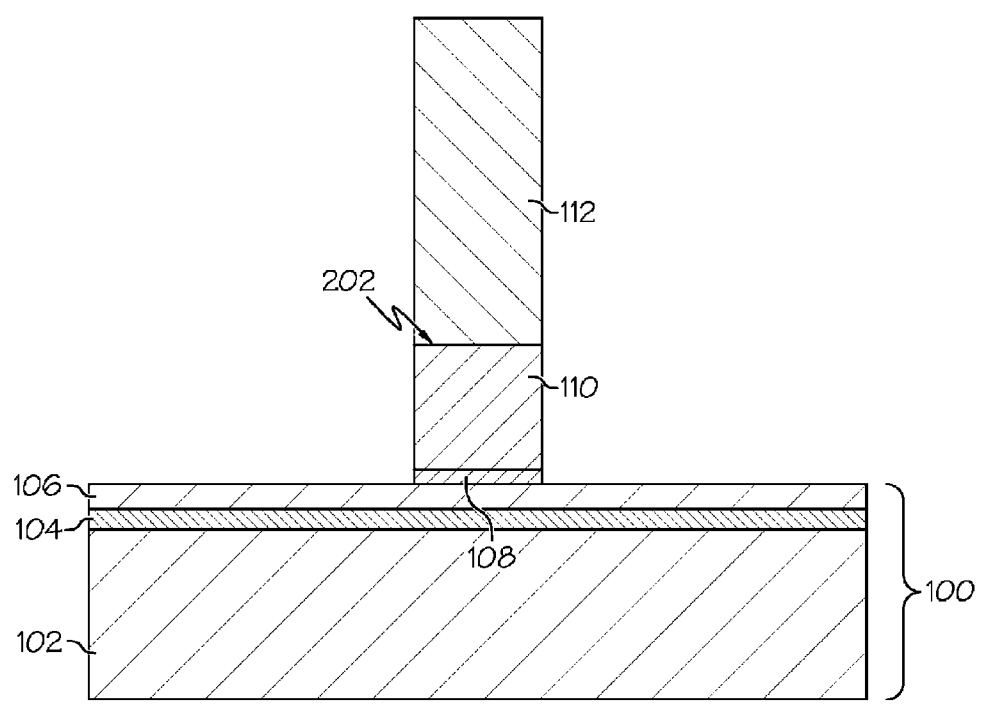

FIG. 2 illustrates the resultant structure following the removal of portions of the gate material layer 108 and the capping layer 110 by an anisotropic etching process such as, for example, an reactive ion etching (RIE) process. The resultant structure includes exposed regions of the substrate 100 and a gate stack 202 feature. Though the illustrated embodiment includes the gate stack 202, such an embodiment is merely an example. Alternate embodiments are not limited to gate stack structures, and may include, for example, any feature or structure that may be formed on the substrate 202. In this regard, the gate stack 202 may represent a structure or feature such as a protuberance, projection, or protrusion formed on or in the substrate 202. For illustrative purposes, such a structure or feature is represented as the gate stack 202.

Figure 3:
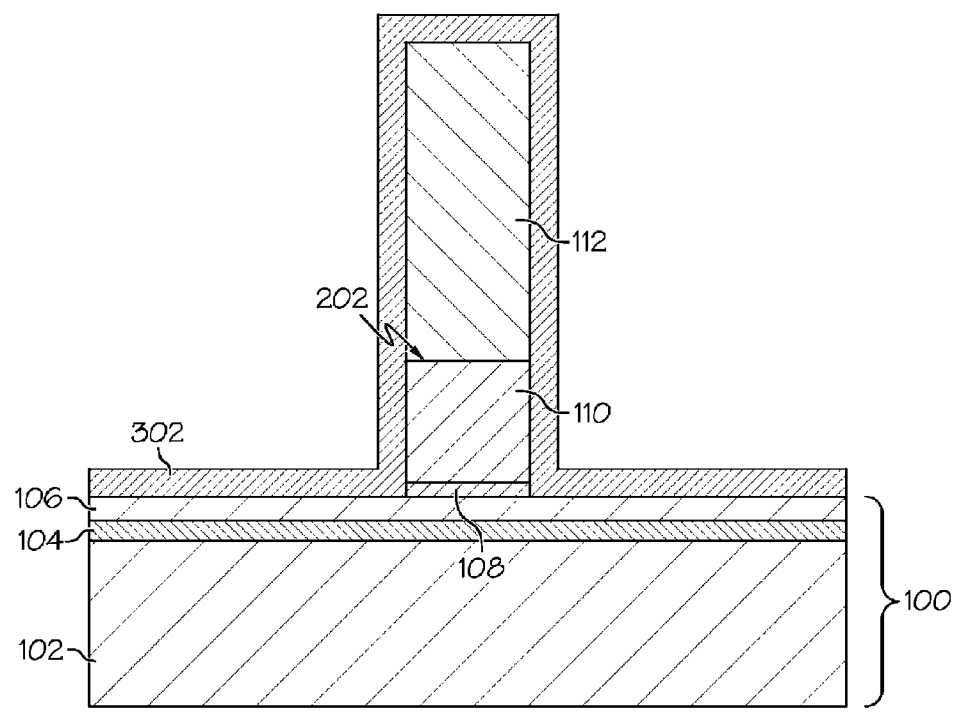

FIG. 3 illustrates the deposition of a masking layer 302 that is formed over the exposed portions of the substrate 100 and over the gate stack 202 and resist material 112. The masking layer 302 may be deposited using, for example, a spin-on deposition process. The masking layer 302 may include any suitable material including such as, for example, an anti-reflective coating (ARC) material such as, silicon nitride, silicon oxynitride or a combination of different layered materials.

Figure 4A:
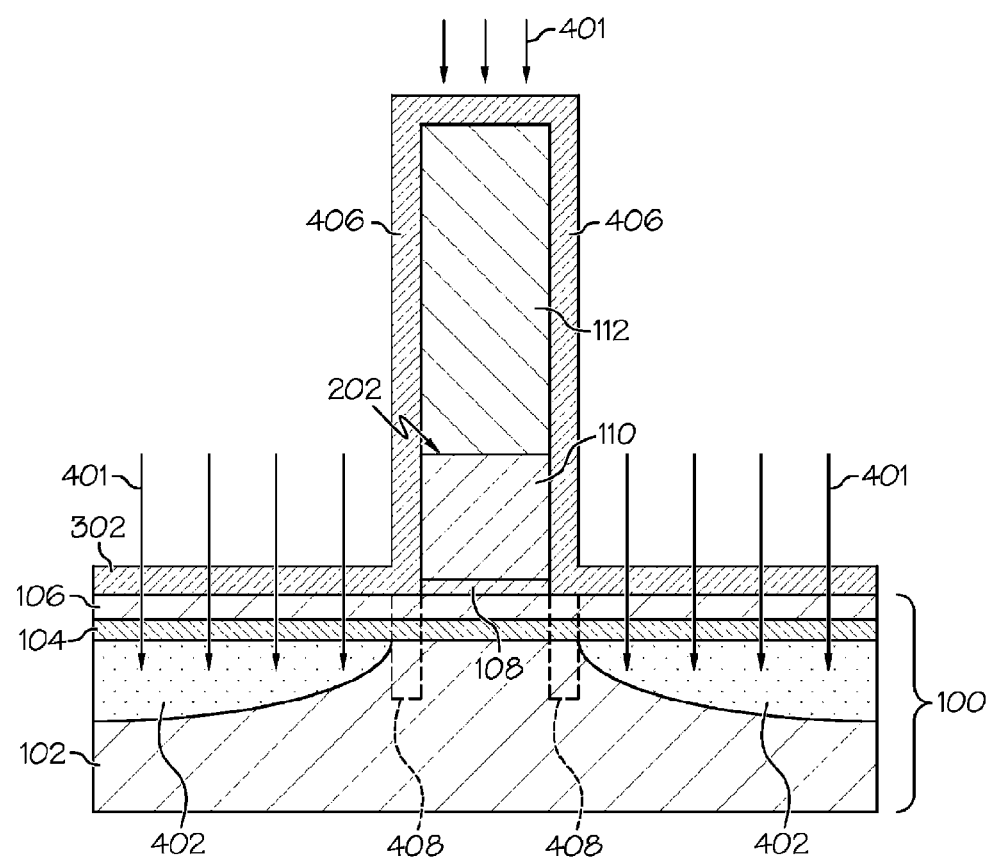
FIG. 4A illustrates the implantation of ions.
Figure 4B:
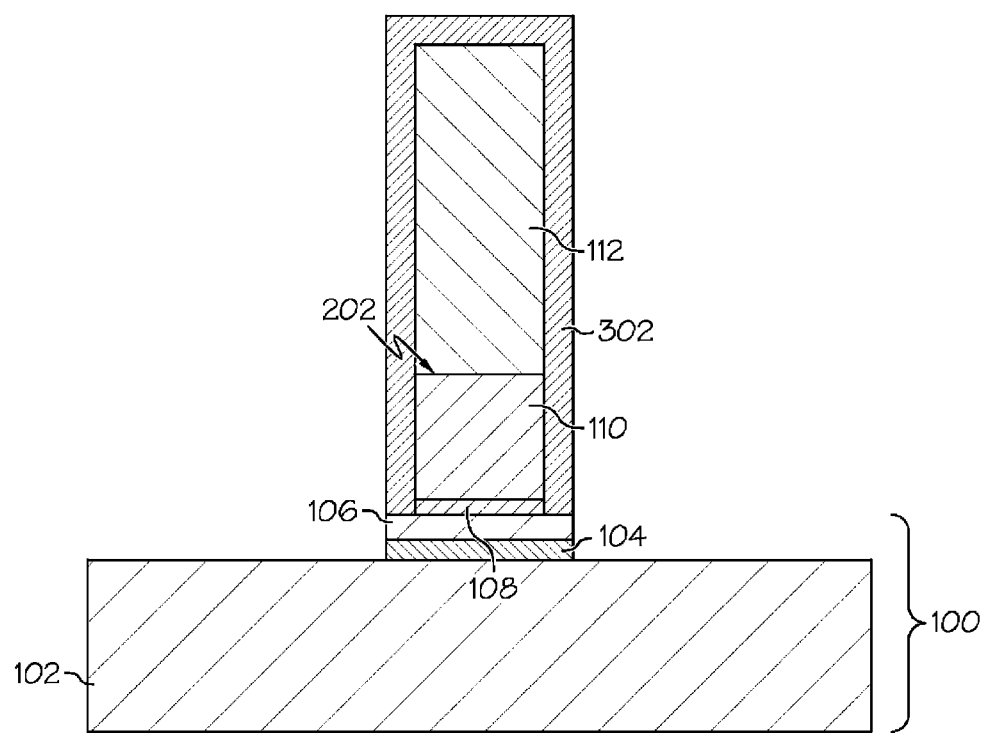
FIG. 4B illustrates the removal of portions of the substrate.

FIG. 4A illustrates the implantation of ions (indicated by the arrows 401) to form a doped source region 402 and drain region 404 in the substrate 100. The ions 401 have enough energy to penetrate the horizontal portions of the masking layer 302 (i.e., the portions of the masking layer arranged parallel to the substrate 100 surface) however, the ions 401 do not have enough energy to penetrate the vertical portions 406 of the masking layer 302 resulting in regions 408 of the substrate 100 that remains undoped by the ions 401. Though the illustrated embodiment of FIG. 4 illustrates the implantation of ions 401 into the substrate 100, alternate exemplary embodiments may include, for example, removing portions of the masking layer 302 and the substrate 100 using an etching process such as RIE as shown in FIG. 4B.

Figure 5:
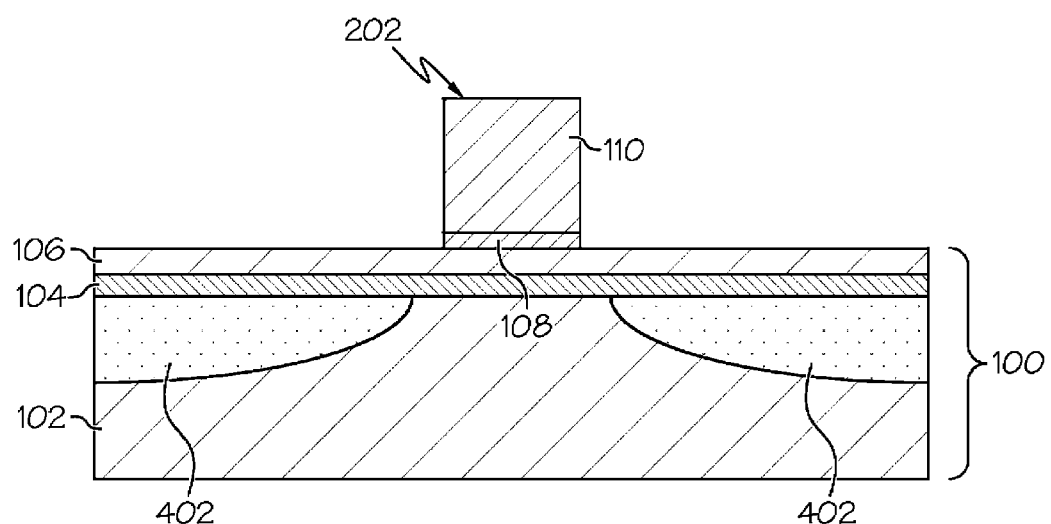

FIG. 5 illustrates the resultant structure following the removal of the masking layer 302 and the resist material 112 (of FIG. 4) using an etching process such as, for example, a RIE process.

Figure 6:
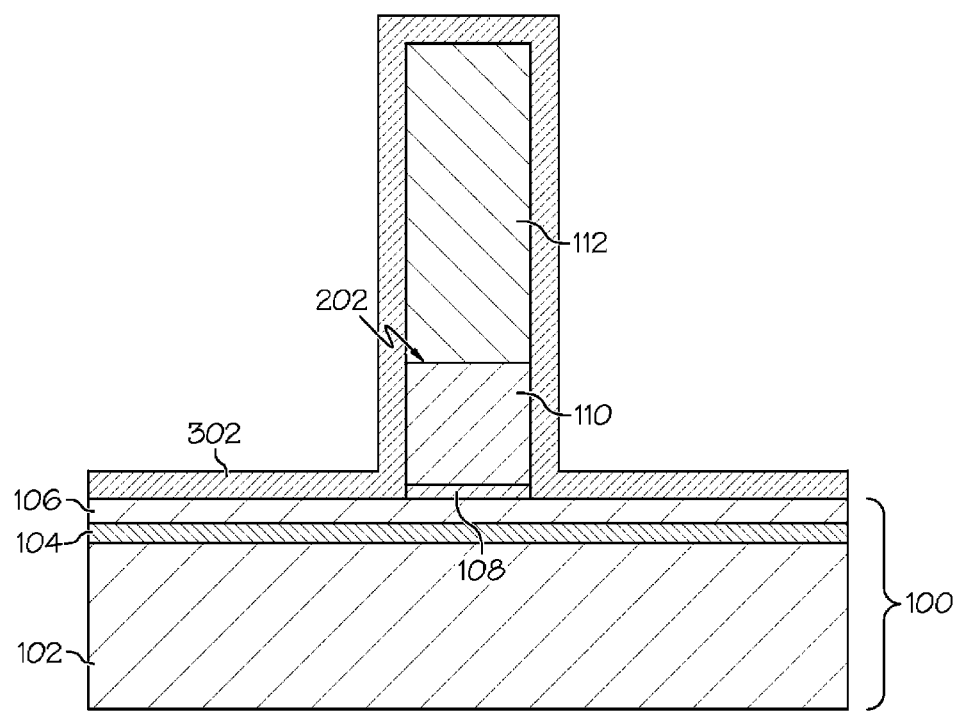

FIGS. 6-9 illustrate an alternate exemplary method for forming a FET device. FIG. 6 illustrates a resultant structure similar to the structure described above in FIG. 3 following the formation of the masking layer 302.

Figure 7:
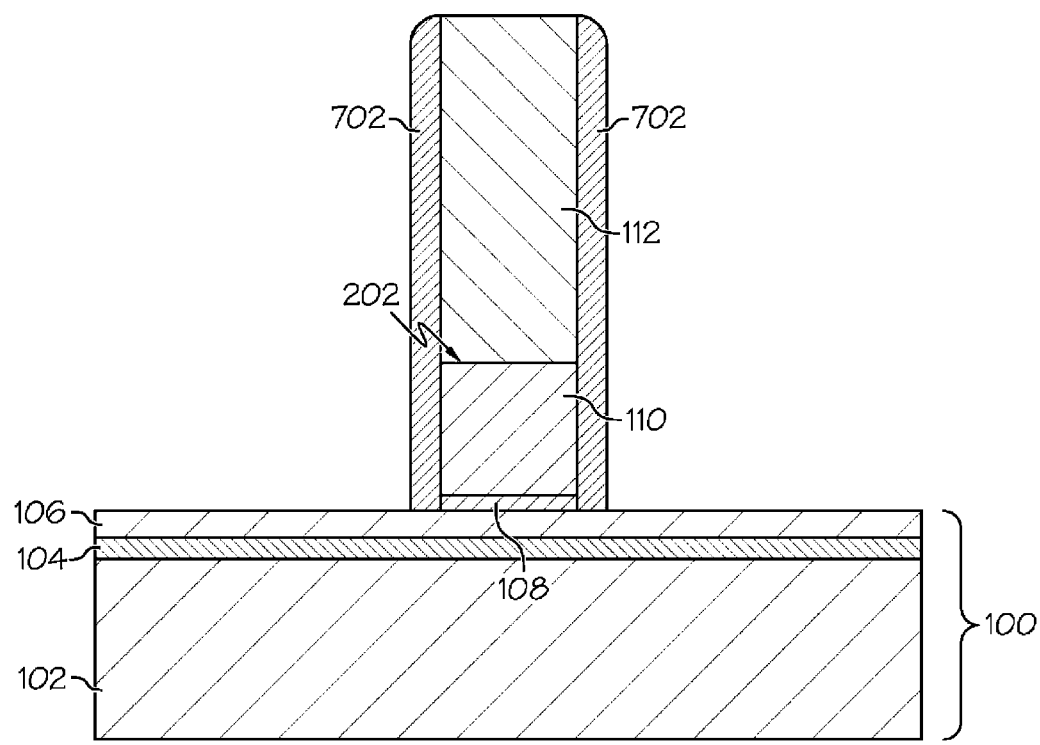

FIG. 7 illustrates the resultant structure following the removal of portions of the masking layer 302 that exposes portions of the substrate 100 and defines spacers 702. The portions of the masking layer 302 may be removed by, an anisotropic etching process such as, for example a RIE process.

Figure 8:
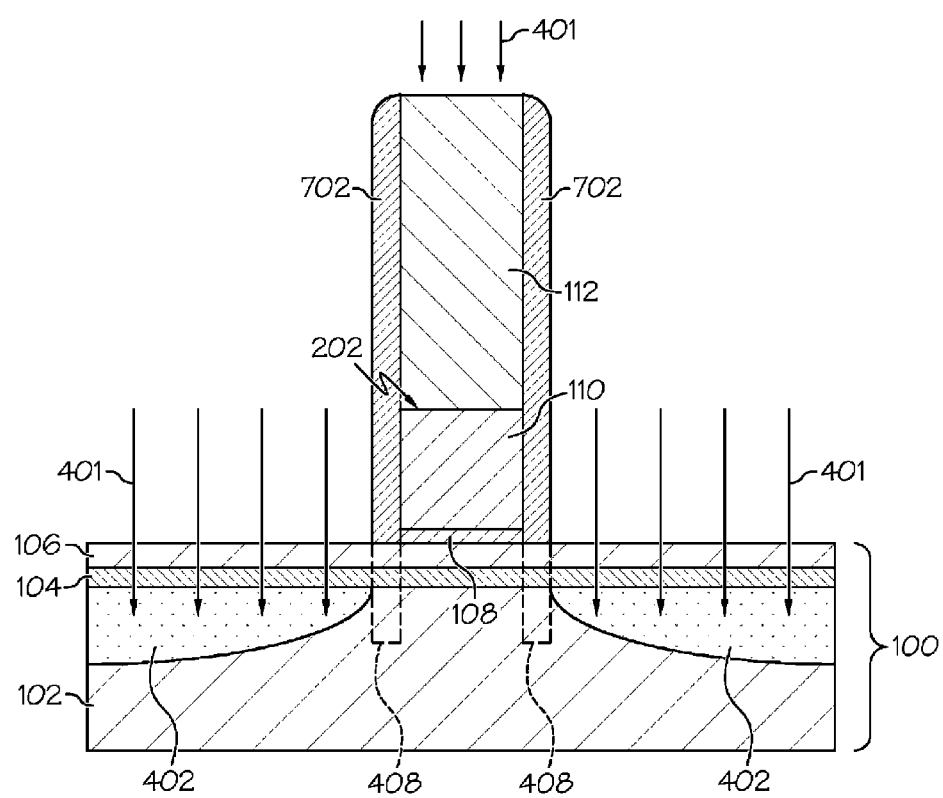

FIG. 8 illustrates the implantation of ions (indicated by the arrows 401) to form a doped source region 402 and drain region 404 in the substrate 100. The spacers 702 protect portions of the substrate 100 resulting in regions 408 of the substrate 100 that remain undoped by the ions 401.

Figure 9:
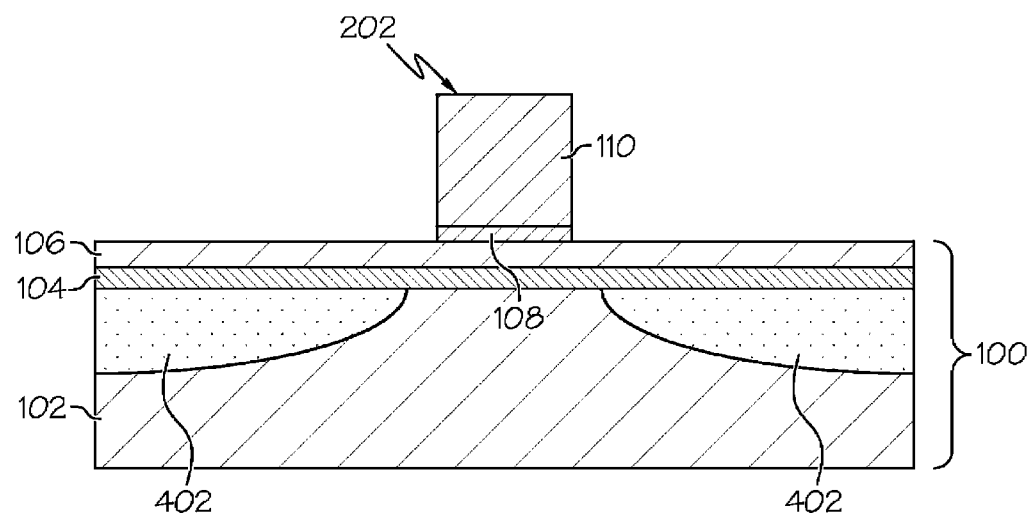

FIG. 9 illustrates the resultant structure following the removal of the spacers 702 and the resist material 112 (of FIG. 8) using an etching process such as, for example, a RIE process.

Figure 10:
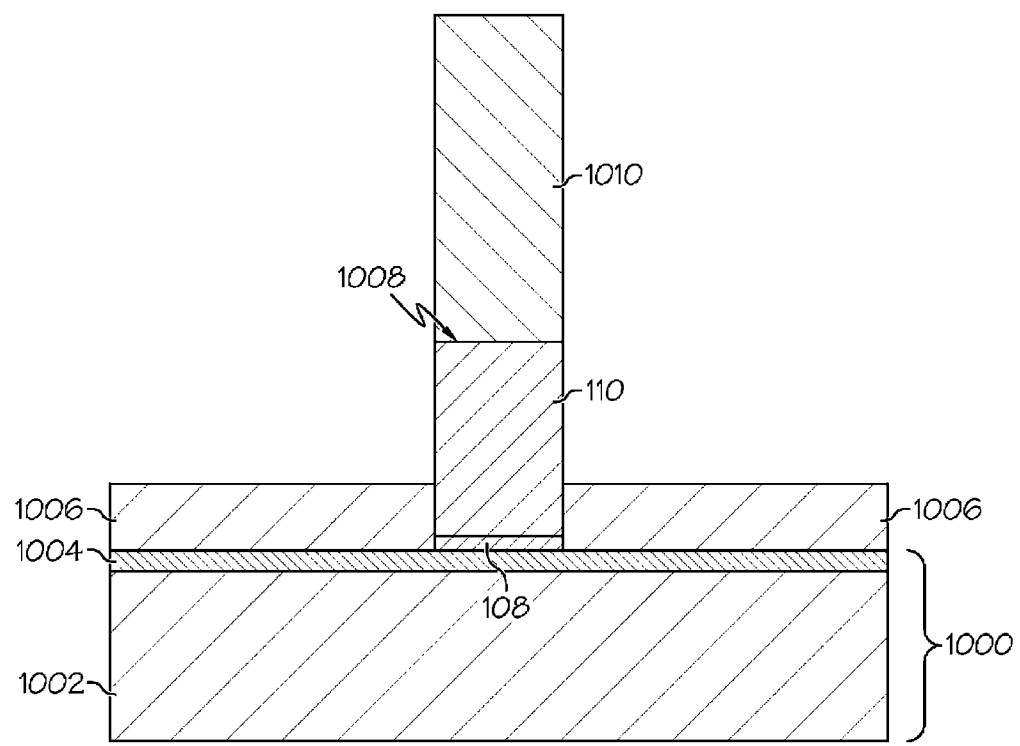

FIGS. 10-14 illustrate a side cut-away view of an alternate exemplary method for forming a multi-gate field effect transistor (MUGFET) device. Referring to FIG. 10, the illustrated embodiment includes a substrate 1000 that includes a silicon layer 1002 and a dielectric layer 1004 disposed on the silicon layer 1002. Extensions or fins 1006 are disposed on the substrate 1000. A gate stack 1008 that includes a gate material 108 and a capping layer 110 has been patterned over the extensions 1006 following the patterning of photoresist material 1010 and an anisotropic etching process that removes portions of the gate material 108 and the capping layer 110 to define the gate stack 1008.

Figure 11:
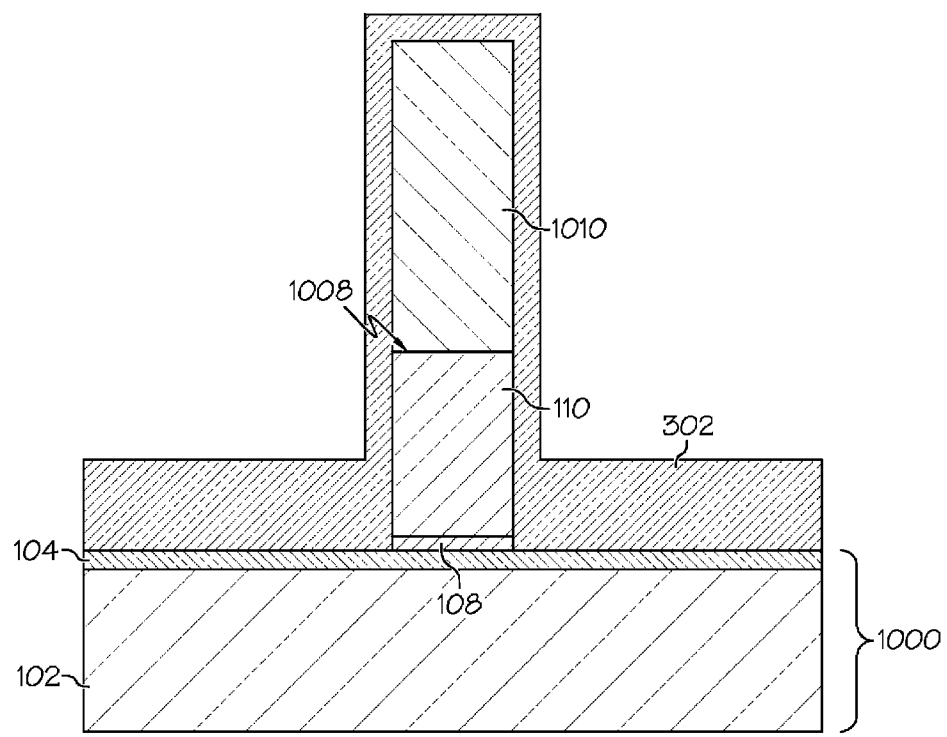

FIG. 11 illustrates the deposition of a masking layer 302 over the extensions 1006, the substrate 1000, the gate stack 1008 and the photoresist material 1010 using, for example, a spin-on deposition process similar to the process described above.

Figure 12:
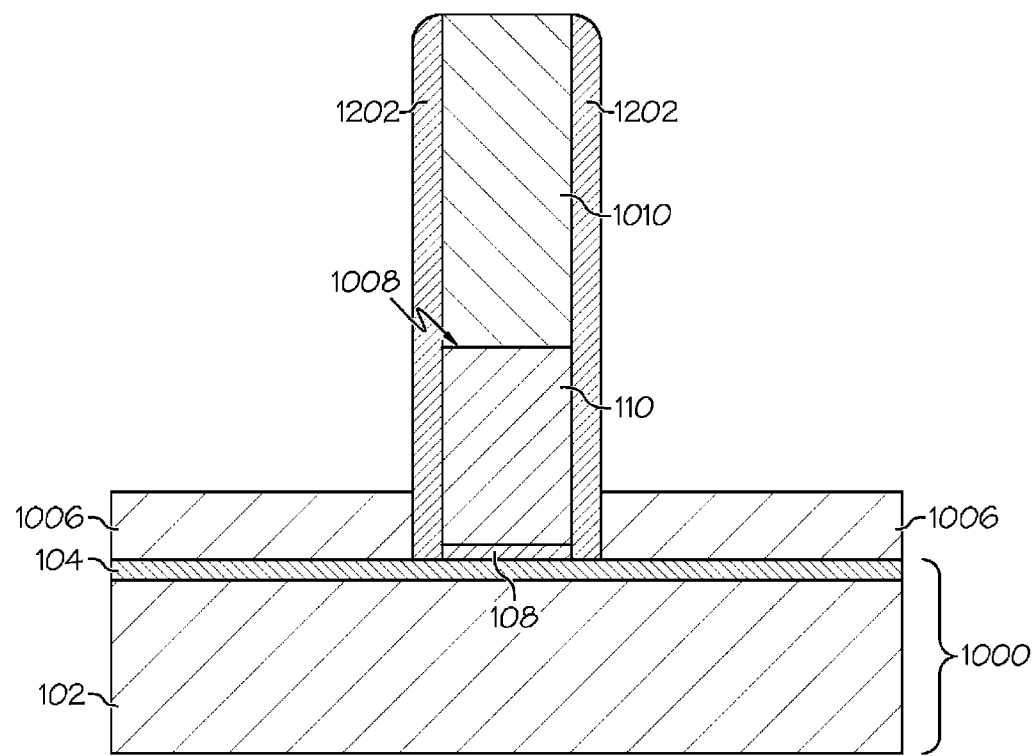

FIG. 12 illustrates the resultant structure following the removal of portions of the masking layer 302 that defines spacers 1202. The spacers 1202 are formed along side walls of the gate stack 1008; the photoresist material 1010; and over portions of the extensions 1006 adjacent to the gate stack 1008. The portions of the masking layer 302 may be removed using, for example, an anisotropic etching process such as, a RIE process.

Figure 13:
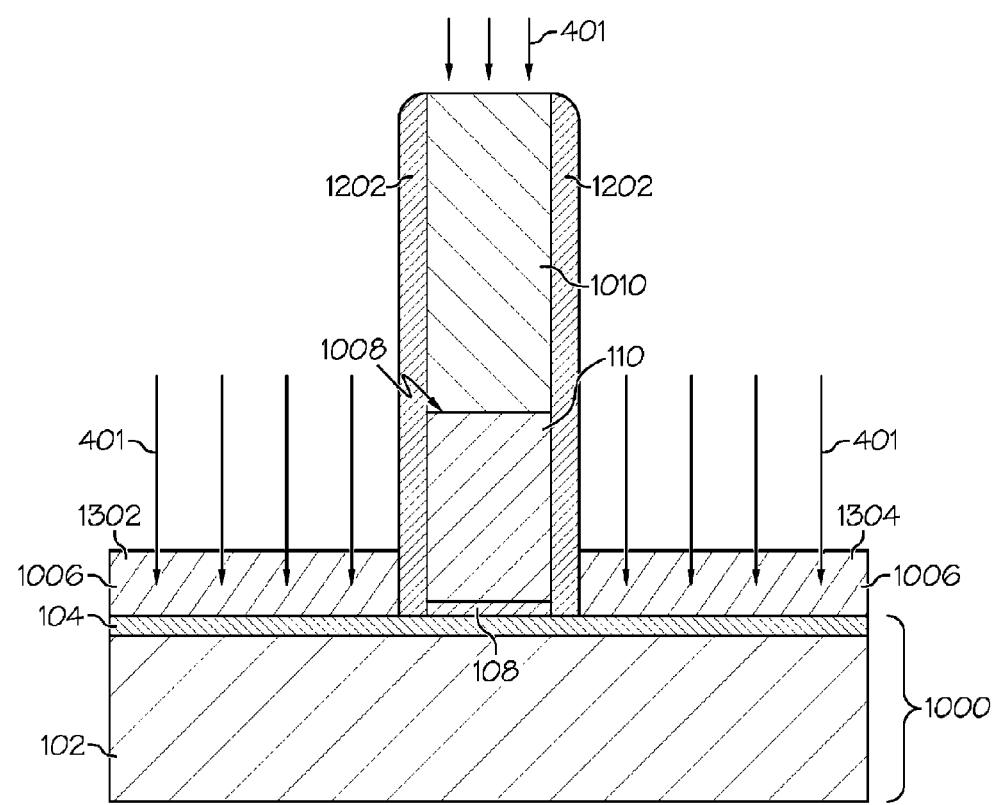

FIG. 13 illustrates the implantation of ions (indicated by the arrows 401) to form a doped source region 1302 and drain region 1304 in the extensions 1006.

Figure 14:
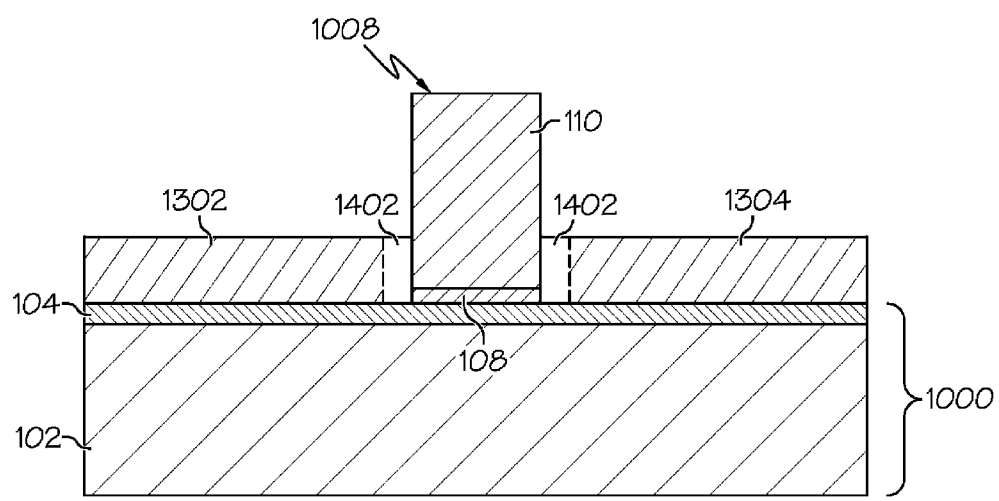

FIG. 14 illustrates the resultant structure following the removal of the spacers 1202 (of FIG. 13). The resultant structure includes regions 1402 in the extensions 1304 that remained undoped by the ions 401 due to the spacers 1202.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a field effect transistor device, the method including:

forming at least one layer of a feature material on a substrate, wherein the feature material comprises a gate dielectric layer;

patterning a photolithographic resist material on only a first portion of the at least one layer of the feature material;

removing one or more second portions of the feature material following the patterning of the photolithographic resist material to define a feature and one or more exposed regions of the substrate, wherein the one or more exposed regions are not located between the photolithographic resist material and the first portion of the at least one layer of the feature material;

depositing a masking material layer over the photolithographic resist material and the one or more exposed regions of the substrate;

modifying the one or more exposed portions of the substrate by passing ions through the masking material layer and depositing the ions in the one or more exposed portions of the substrate; and removing the masking material layer and the photolithographic resist material following the modifying.

2. The method of claim 1, wherein forming the at least one layer of a feature material includes:
   forming the gate dielectric layer on the substrate; and
   forming a polysilicon layer on the gate dielectric layer.

3. The method of claim 1, wherein the portions of the feature material are removed by an anisotropic etching process.

4. The method of claim 1, wherein the masking material layer is deposited using a spin-on process.

5. The method of claim 1, wherein the masking material layer includes an anti-reflective coating material.

6. A method for forming a field effect transistor device, the method including:
   forming layers of gate stack materials on a substrate, wherein the forming layers of the gate stack materials includes forming a gate dielectric layer on the substrate, and forming a polysilicon layer on the gate dielectric layer;
   patterning a photolithographic resist material on the layers of gate stack materials;
   removing portions of the gate stack materials to define a gate stack and one or more exposed regions of the substrate;
   depositing a masking material layer over the photolithographic resist material and the one or more exposed regions of the substrate;
   implanting ions in the one or more exposed regions of the substrate; and
   removing the masking material layer to define a spacer after the implanting.

7. The method of claim 6, wherein the method further includes removing the photolithographic resist material following the implantation of the ions.

8. The method of claim 6, wherein the portions of the gate stack materials are removed by an anisotropic etching process.

9. The method of claim 6, wherein the masking material layer is deposited using a spin-on process.

10. The method of claim 6, wherein the masking material layer includes an anti-reflective coating material.

11. The method of claim 6, wherein the implanting ions in the one or more exposed regions of the substrate partially defines a source region and a drain region proximate to the gate stack.

12. The method of claim 6, wherein the portions of the masking material layer are removed by an anisotropic etching process.

13. A method for forming a field effect transistor device, the method including:
   forming layers of gate stack materials on a substrate and over a source and drain extension portion disposed on the substrate, wherein the forming layers of the gate stack materials includes forming a gate dielectric layer on the substrate, and forming a polysilicon layer on the gate dielectric layer;
   patterning a photolithographic resist material on the layers of gate stack materials;
   removing portions of the gate stack materials to define a gate stack and one or more expose regions of the substrate;
   depositing a masking material layer over the photolithographic resist material and the one or more exposed regions of the substrate, including the source and drain extension portion;
   implanting ions in the source and drain extension region; and
   removing portions of the masking material layer to define a spacer after the implanting.

14. The method of claim 13, wherein the method further includes removing the photolithographic resist material following the implantation of the ions.

15. The method of claim 13, wherein the masking material layer is deposited using a spin-on process.

16. The method of claim 13, wherein the masking material layer includes an anti-reflective coating material.

* * * * *